United States Patent
Eun et al.

(10) Patent No.: US 7,851,298 B2
(45) Date of Patent: Dec. 14, 2010

(54) METHOD FOR FABRICATING TRANSISTOR IN A SEMICONDUCTOR DEVICE UTILIZING AN ETCH STOP LAYER PATTERN AS A DUMMY PATTERN FOR THE GATE ELECTRODE FORMATION

(75) Inventors: Yong Seok Eun, Seongnam-si (KR); Su Ho Kim, Icheon-si (KR); An Bae Lee, Seoul (KR); Hye Jin Seo, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/259,799

(22) Filed: Oct. 28, 2008

(65) Prior Publication Data

US 2009/0111255 A1  Apr. 30, 2009

(30) Foreign Application Priority Data

Oct. 29, 2007  (KR) ............... 10-2007-0109120
Mar. 14, 2008  (KR) ............... 10-2008-0023999

(51) Int. Cl.
*H01L 21/336* (2006.01)
*H01L 29/78* (2006.01)

(52) U.S. Cl. ............... 438/221; 438/296; 438/589; 257/E21.429

(58) Field of Classification Search ............... 438/270, 438/272, 589, 221, 296; 257/E21.621, E21.429
See application file for complete search history.

(56) References Cited

U.S. PATENT DOCUMENTS

| | | | | |
|---|---|---|---|---|
| 5,861,331 A | * | 1/1999 | Chien | 438/238 |
| 2007/0259499 A1 | * | 11/2007 | Eun et al. | 438/270 |
| 2008/0150021 A1 | | 6/2008 | Koops et al. | |
| 2008/0203483 A1 | | 8/2008 | Kuroki | |

FOREIGN PATENT DOCUMENTS

| KR | 10-2005-0004352 | 1/2005 |
|---|---|---|
| KR | 10-0713001 | 4/2007 |
| KR | 10-2008-0087518 | 10/2008 |

* cited by examiner

*Primary Examiner*—Anh D Mai
(74) *Attorney, Agent, or Firm*—Marshall, Gerstein & Borun LLP

(57) ABSTRACT

Provided is a method for fabricating a transistor in a semiconductor device. The method includes forming an etch stop layer pattern over a semiconductor substrate; forming a semiconductor layer for covering the etch stop layer pattern; forming a recess trench that exposes an upper surface of the etch stop layer pattern by etching the semiconductor layer pattern; removing the etch stop layer pattern exposed in the recess trench; and forming a gate that fills the recess trench.

8 Claims, 12 Drawing Sheets

|  |  | 50:1 HF (Å/sec) | 9:1 BOE (Å/sec) | 300:1 BOE (Å/sec) |
|---|---|---|---|---|
| Thermal oxide layer | | 1.0 | 15.0 | 0.2 |
| BPSG(8.5%) | As deposition | 17.2 |  | 2.4 |
| | After annealing at 800℃ for 20seconds | 8.3 |  | 1.3 |
| PSG(8%) | As deposition | 20.3 | 178.9 | 3.0 |
| | After annealing at 510℃ for 86seconds | 19.5 | 169.1 | 2.8 |
| HDP | As deposition | 1.6 | 27.1 | 0.6 |
| | After annealing at 1050℃ for 30seconds | 1.2 | 19.6 | 0.3 |

METHOD FOR FABRICATING TRANSISTOR IN A SEMICONDUCTOR DEVICE UTILIZING AN ETCH STOP LAYER PATTERN AS A DUMMY PATTERN FOR THE GATE ELECTRODE FORMATION

CROSS-REFERENCE TO RELATED APPLICATIONS

Priority to Korean patent application nos. 10-2007-0109120, filed on Oct. 29, 2007, and 10-2008-0023999, filed on Mar. 14, 2008, the disclosures of which are incorporated by reference in their entireties, is claimed.

BACKGROUND OF THE INVENTION

1. Field of the Invention

The invention relates to a method for fabricating a transistor in a semiconductor device, and more particularly, to a method for fabricating a transistor including a recess gate.

2. Brief Description of Related Technologies

As the degree of integration of memory devices, such as a Dynamic Random Access Memory (DRAM), is increased, a design rule of the device has been decreased. The decrease of the design rule results in a decrease of a Critical Dimension (CD) of a gate of a transistor and, thus, a shortening of the length of a channel between a source and a drain. The shortening of the channel length results in a short channel effect, which can result in deterioration of the operation properties of the transistor, such as, for example, an increase in leakage current and a reduction in refresh properties.

A punch-through between a source region and a drain region of the transistor due to the short channel effect can act as a main cause of malfunction of the transistor device. Also, a shortened channel length of the transistor and variation in the threshold voltage of the channel can have a relatively large influence on the operation properties of the transistor. As the channel length is shortened, it becomes more difficult to gradually control the threshold voltage in the channel, i.e. a threshold voltage control margin is sharply weakened. The variation in the threshold voltage can inhibit operational stability of the semiconductor device.

In order to compensate for the short channel effect caused by the reduction of the channel length, attempts have been made to produce more channel length within limited area on a semiconductor substrate. For example, a recess gate structure can be formed by etching an active region of the semiconductor substrate under a gate to form a recess groove, and the gate can then be formed so as to fill the recess groove. The recess groove is generally formed by selectively etching the surface of the active region.

When forming a plurality of gates at the same time, the etch depth by the selective etch process is varied from position to position, which can result in the recess grooves having different depths. Non-uniformity of the depths of the recess grooves causes the channel length to be varied. Therefore, since the channel length is varied among the memory cell transistors, the threshold voltage of the transistor is also varied. It is difficult to maintain reliably uniform operation properties of the memory cell transistors when the distribution in the threshold voltage of the cell transistors is varied.

Therefore, a method for forming a transistor capable of improving the uniformity of CD of the channel length, while ensuring increased channel length with respect to the limited gate CD is needed.

SUMMARY OF THE INVENTION

According to an embodiment of the invention, a method for fabricating a transistor in a semiconductor device includes: forming an etch stop layer pattern over a semiconductor substrate; forming a semiconductor layer for covering the etch stop layer pattern; etching the semiconductor layer pattern to form a recess trench that exposes an upper surface of the etch stop layer pattern; removing the etch stop layer pattern exposed in the recess trench; and forming a gate that fills the recess trench.

According to another embodiment of the invention, a method for fabricating a transistor in a semiconductor device includes: forming an etch stop layer pattern over a semiconductor substrate; forming a burying insulation layer for isolation that covers the etch stop layer pattern; selectively etching the burying insulation layer to form an opening that exposes the etch stop layer pattern and a neighboring portion of the semiconductor substrate; forming a semiconductor layer that fills the opening; selectively etching the semiconductor layer to form a recess trench that exposes an upper surface of the etch stop layer pattern; removing the etch stop layer pattern exposed in the recess trench; and forming a gate that fills the recess trench.

According to yet another embodiment of the invention, a method for fabricating a transistor in a semiconductor device includes: forming an etch stop layer pattern over a semiconductor substrate; forming a semiconductor layer that covers the etch stop layer pattern; selectively etching the semiconductor layer and a portion of the semiconductor substrate therebelow to form an isolation trench; forming a burying insulation layer that fills the isolation trench; selectively etching the semiconductor layer exposed by the burying insulation layer to form a recess trench that exposes an upper surface of the etch stop layer pattern; removing the etch stop layer pattern exposed in the recess trench; and forming a gate that fills the recess trench.

DESCRIPTION OF SPECIFIC EMBODIMENTS

A method for fabricating a photomask in accordance with specific embodiments of the invention will be described in detail with reference to the accompanying drawings.

Embodiment 1

An embodiment of the invention provides a method for fabricating a transistor in which an etch stop layer pattern is first formed at a gate forming position, a semiconductor layer for providing an active region is formed over the etch stop layer pattern, and the semiconductor layer is then etched to form a recess trench to be filled with a gate. Since the etch can be ended at the same time over the etch stop layer pattern, a plurality of the recess trenches can be formed with substantially uniform depths. Therefore, channel lengths can be substantially equal. As such, it is possible to induce the gate channels to have substantially uniform width across the entire wafer, and it is thus possible to effectively inhibit variation in threshold voltage caused by variation in the channel length. Since distribution of the threshold voltage can be substantially uniform, operation properties of cell transistors constructing a memory cell can also be substantially uniform.

Figure 1:
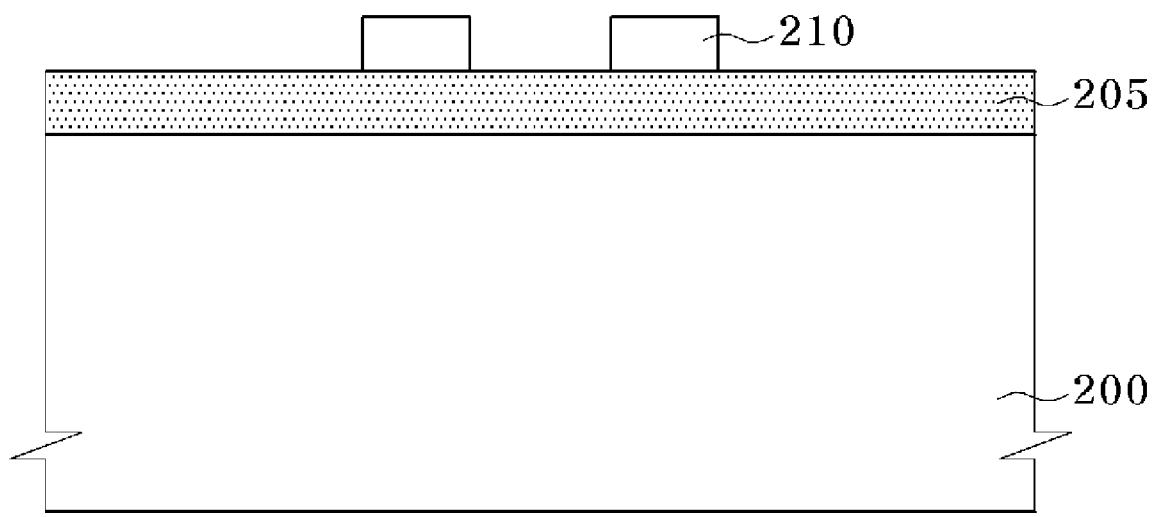
FIGS. 1 through 12 illustrate a method for fabricating a transistor in a semiconductor device according to an embodiment of the invention.

Referring to FIG. 1, an etch stop layer 205 is deposited over a semiconductor substrate 200. The etch stop layer 205 can act as an end point to stop a subsequent etch process for forming a recess trench. The etch stop layer 205 can also act as a barrier for preventing an over etch, by which the semiconductor substrate 200 is etched undesirably. The etch stop layer 205 can include, for example, a nitride layer. The etch stop layer 205 is preferably formed to a thickness capable of effectively reducing a dip time in a wet etch solution during performance of a subsequent process for removing the etch stop layer 205 with the wet etching solution. For example, the etch stop layer 205 can be formed to a thickness in a range of 30 to 300 Å. A photoresist layer pattern 210, defining a region in which a recess trench is to be subsequently formed, is formed by coating, exposing, and developing a photoresist layer over the etch stop layer 205.

Figure 2:
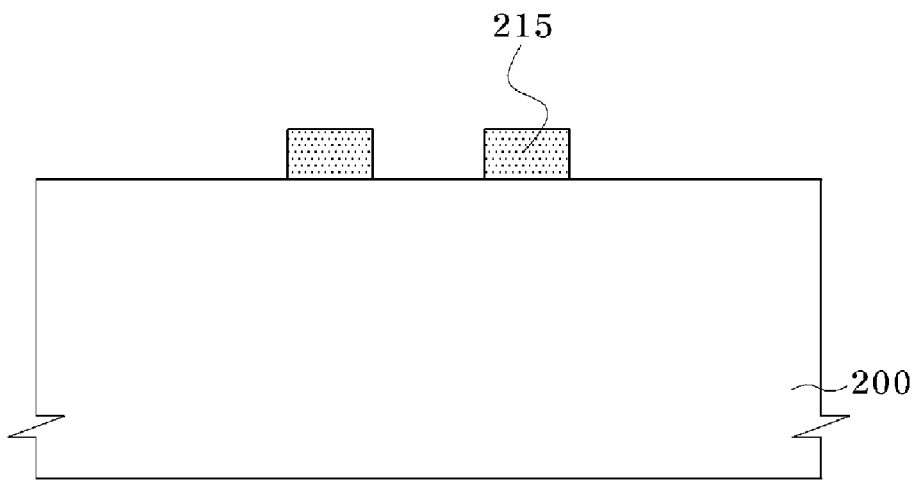

Referring to FIG. 2, an etch stop layer pattern 215 is formed by etching the etch stop layer 205 (refer to FIG. 1), using the photoresist layer pattern 210 as an etch mask. The portion of the semiconductor substrate 200 blocked by the etch stop layer pattern 215 is the region in which the recess trench can be subsequently formed, i.e. a point to be overlapped by a gate. The portion of the semiconductor substrate 200 blocked by the etch stop layer pattern 215 can act as a barrier for preventing the semiconductor substrate 200 from being over etched during a subsequent etch process for forming the recess trench. Next, the photoresist layer pattern 210 is removed using, for example, an ashing process.

Figure 3:
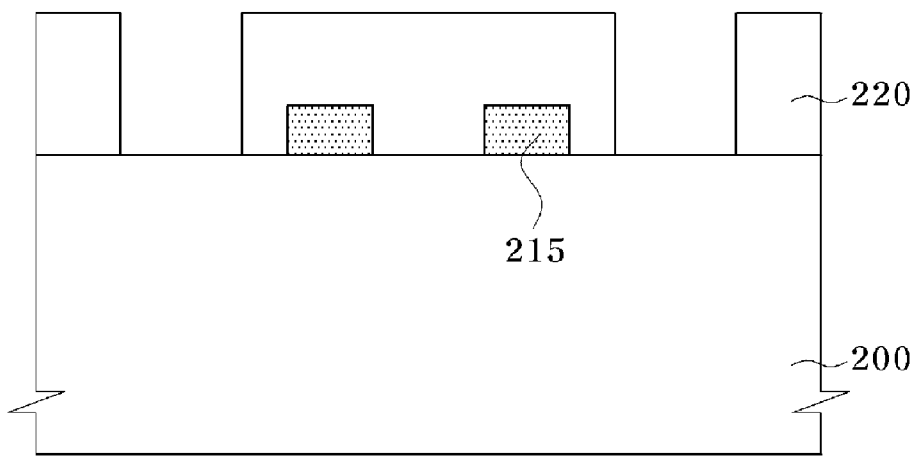

Referring to FIG. 3, a first mask layer pattern 220, which exposes a portion of the semiconductor substrate 200 while blocking the region formed with the etch stop layer pattern 215, is formed over the semiconductor substrate 200. The first mask layer pattern 220 can be formed, for example, of a photoresist layer. The region exposed by the first mask layer pattern 220 is a region in which an isolation layer can be subsequently formed.

Figure 4:
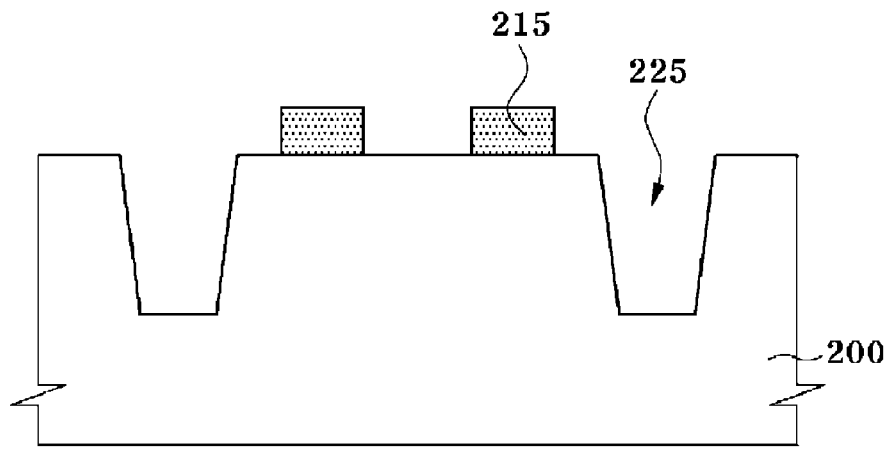

Referring to FIG. 4, an isolation trench 225 is formed by etching the exposed portion of the semiconductor substrate 200 to a predetermined depth, using the first mask layer pattern 220 as an etch mask. The isolation trench 225 can be formed, for example, to a depth in a range of 500 to 1500 Å from the surface of the semiconductor substrate 200. Then, the first mask layer pattern 220 can be removed.

Figure 5:
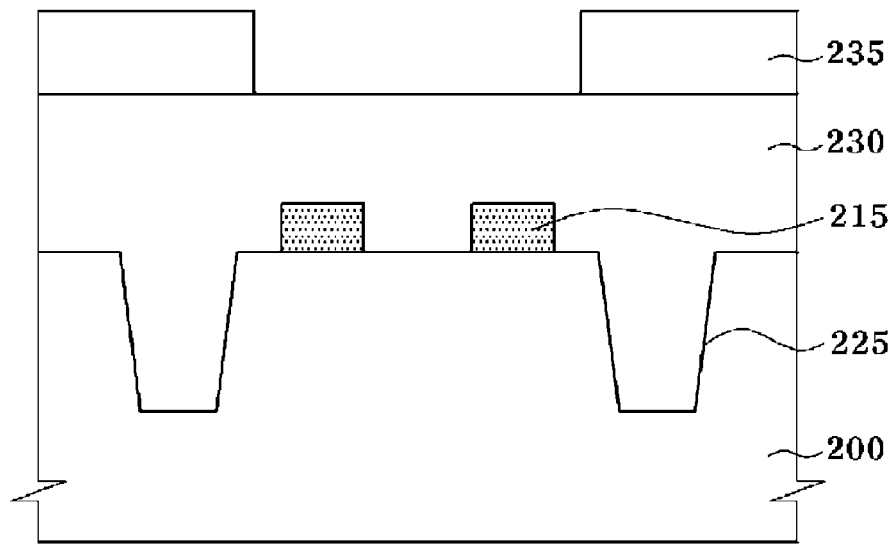

Referring to FIG. 5, a burying insulation layer 230 for burying the isolation trench 225 and the etch stop layer pattern 215 is formed. Preferably, a side wall oxide layer (not shown), a liner nitride layer (not shown), and a liner oxide layer (not shown) are formed on the exposed surface of the isolation trench 225. The burying insulation layer 230 is formed over the semiconductor substrate 200 to bury the isolation trench 225 and the etch stop layer pattern 215. The burying insulation layer 230 can be formed using, for example, a Chemical Vapor Deposition (CVD) or High Density Plasma process (HDP). The burying insulation layer 230 can be formed, for example, of an oxide layer. The burying insulation layer 230 is preferably deposited to a thickness in a range of 2500 to 5000 Å, so that an isolation layer 250 subsequently formed over the semiconductor substrate 200 can have a height in a range of 1500 to 3000 Å. A second mask layer pattern 235 for selectively exposing the burying insulation layer 230 in the region formed with the etch stop layer pattern 215 is formed.

Figure 6:
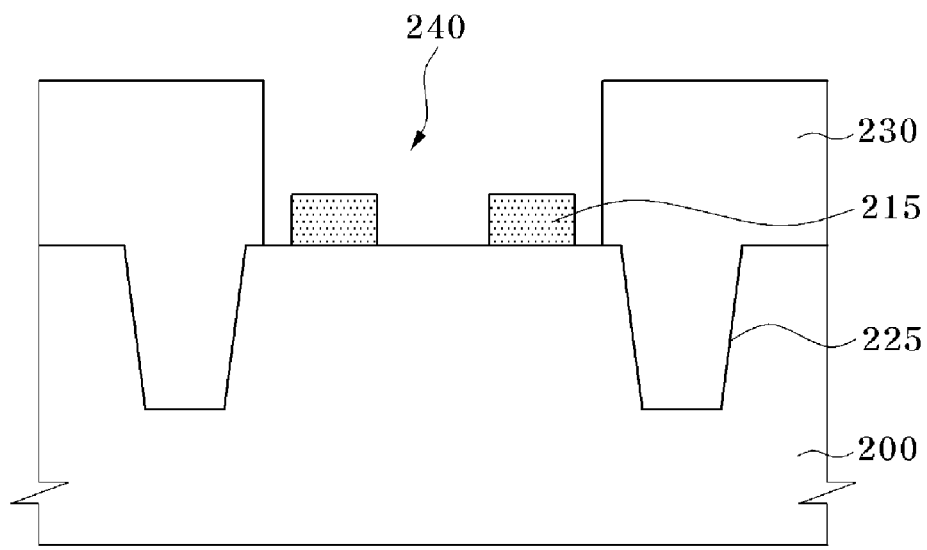

Referring to FIG. 6, an opening 240 for exposing the etch stop layer pattern 215 is formed by etching an exposed portion of the burying insulation layer 230, using the second mask layer pattern 235 (refer to FIG. 5) as an etch mask. The etch process is preferably preformed until the surface of the semiconductor substrate 200 in the region within the opening 240 formed without the etch stop layer pattern 215 is exposed. The region, in which the semiconductor substrate 200 and the etch stop layer pattern 215 are exposed by the etch process, can be subsequently formed with an active region, and the region blocked by the second mask layer pattern 235 can subsequently become an isolation region. The opening 240 is overlapped with the subsequently formed active region or exposes a region within the active region. Then, the second mask layer pattern 235 can be removed using, for example, an ashing process.

Figure 7:
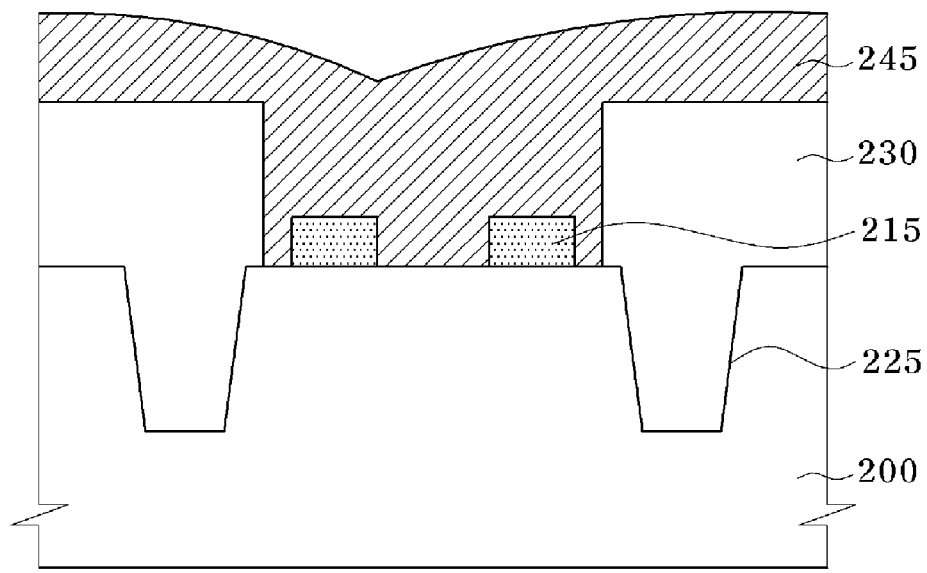

Referring to FIG. 7, the opening 240 is buried with a semiconductor layer 245. The semiconductor layer 245 can control the depth of the subsequently formed recess trench. The semiconductor layer 245 can include, for example, a polysilicon layer or an amorphous silicon layer. The semiconductor layer 245 can be deposited using, for example, Low Pressure CVD (LPCVD), or the semiconductor layer 245 can be formed, for example, by epitaxial growth. The semiconductor layer 245, which buries the opening 240, is preferably formed to a thickness in a range of 1000 to 1500 Å.

Figure 8:
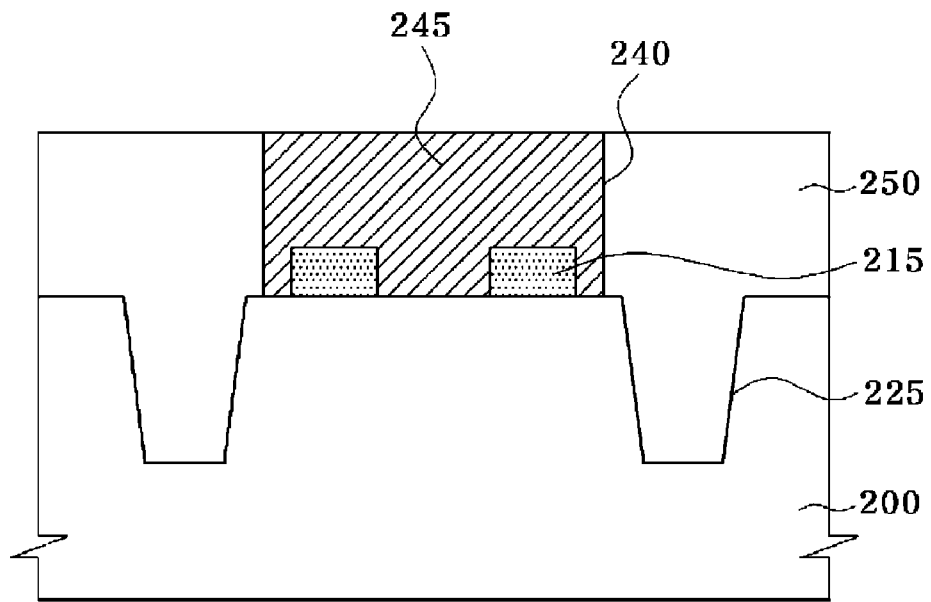

Referring to FIG. 8, an isolation layer 250 for isolating the isolation region and the active region is formed, for example, by performing a planarization process over the semiconductor layer 245 and the burying insulation layer 230 (refer to FIG. 7). The planarization process can be performed using, for example, an etch back or Chemical Mechanical Polishing (CMP).

Figure 9:
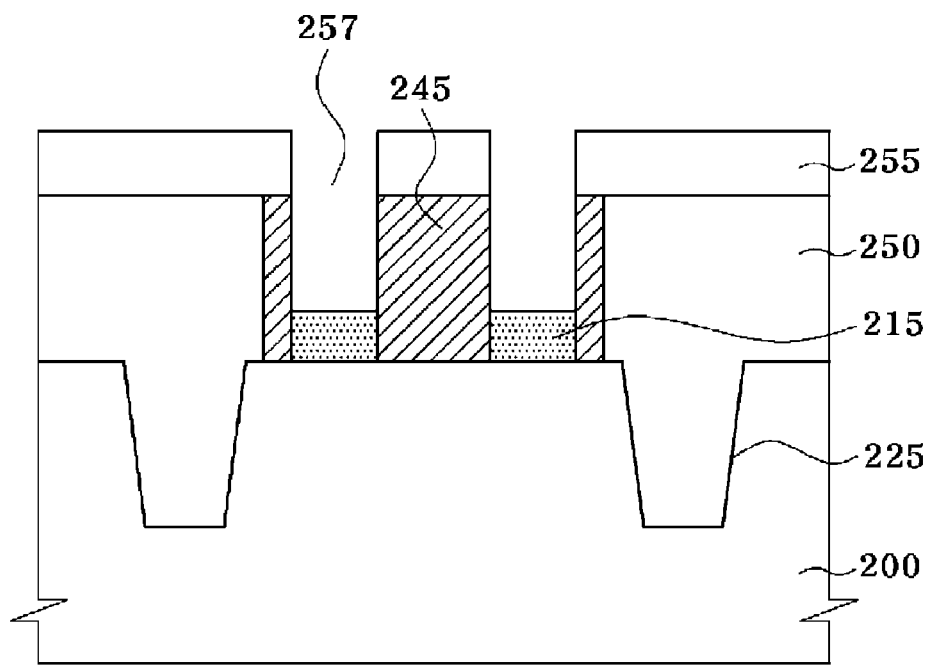

Referring to FIG. 9, a third mask layer pattern 255 for selectively exposing the semiconductor layer 245 in the region formed with the etch stop layer pattern 215 is formed. The third mask layer pattern 255 blocks the portion of the semiconductor layer 245 and the isolation layer 250 in which the etch stop layer pattern 215 is not disposed. A preliminary recess trench 257 for exposing an upper surface of the etch stop layer pattern 215 is formed by etching the exposed portion of the semiconductor layer 245, using the third mask layer pattern 255 as an etch mask. The preliminary recess trench 257 can be aligned in the area to be formed therewith as the forming and etching of the semiconductor layer 245 is proceeded in the state that the etch stop layer pattern 215 is formed. Also, it is possible to prevent poor distribution in the depth of the recess trench by forming the recess trench with the depth thereof being previously designated, instead of controlling the depth of the recess trench later.

Figure 10:
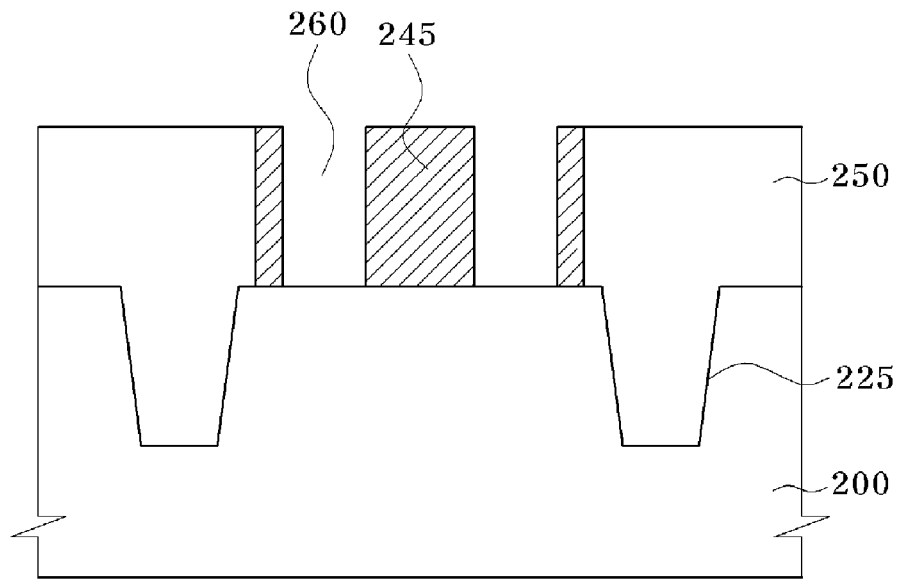

Referring to FIG. 10, after removing the third mask layer pattern 255 (refer to FIG. 9), the etch stop layer pattern 215 in the preliminary recess trench 257 (refer to FIG. 9) is removed. Preferably, the etch stop layer pattern 215 is removed by dipping the semiconductor substrate 200 in a wet etch solution. For example, a phosphoric acid solution ($H_3PO_4$) can be used as the wet etch solution when the etch stop layer pattern 215 is formed of a nitride layer. The etch stop layer pattern 215 is preferably formed to a thickness capable of minimizing the time for which the etch stop layer pattern 215 is dipped in the wet etch solution. For example, the etch stop layer pattern 215 can be formed to a thickness in a range of 30 to 300 Å. Therefore, it is possible to minimize the influence of the wet etch solution on the semiconductor substrate 200 and the isolation layer 250 during removal of the etch stop layer pattern 215. With the removal of the etch stop layer pattern 215 by the wet etch process, the recess trench 260, having, for example, a depth in a range of 1000 to 1500 Å, is formed over the semiconductor substrate 200.

As described above, since the recess trench 260 is formed by forming the semiconductor layer 245 so as to fill the opening 240 formed by etching the burying insulation layer 230, after forming the burying insulation layer 230, and performing an etch process again on the semiconductor layer 245, it is possible to effectively inhibit formation of a horn shaped structure that can result when some of the semiconductor layer 245 remains between the recess trench 260 and the burying insulation layer 230. Therefore, it is possible to inhibit leakage current resulting from the horn shaped structure.

Figure 11:
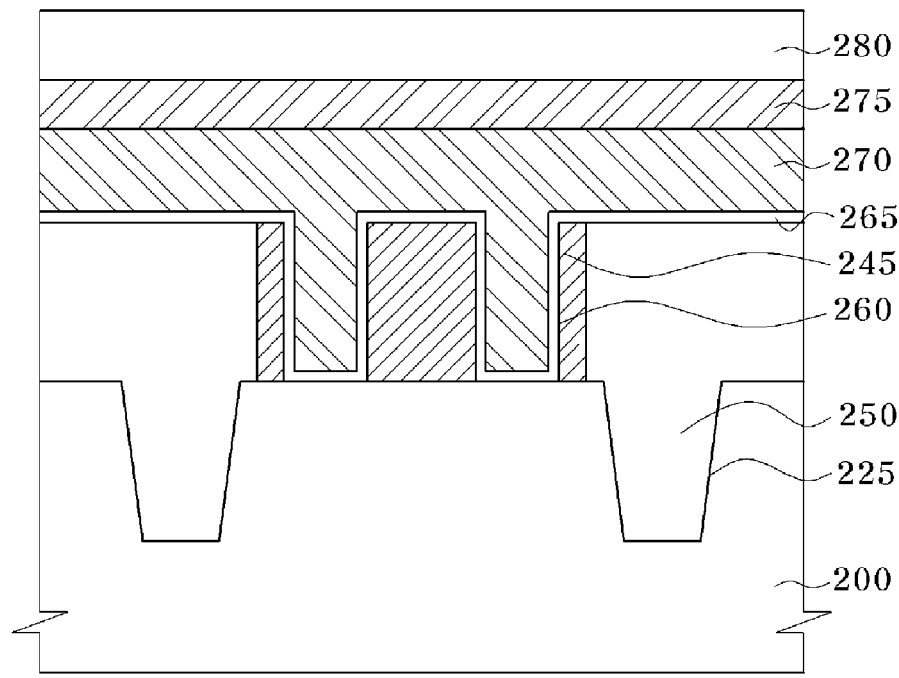

Referring to FIG. 11, a gate forming material, including, for example, a gate insulation layer 265, a gate conductive layer 270, a metal layer 275, and a hard mask layer 280, is deposited over the semiconductor substrate 200 having the recess trench 260. Preferably, a cleaning process is performed on the semiconductor substrate 200 after formation of the recess trench 260 to remove residues remaining over the recess trench 260 and the isolation layer 250. Then, the gate insulation layer 265, the gate conductive layer 270, the metal layer 275, and the hard mask layer 280 are sequentially formed overlappingly with the recess trench 260.

Figure 12:
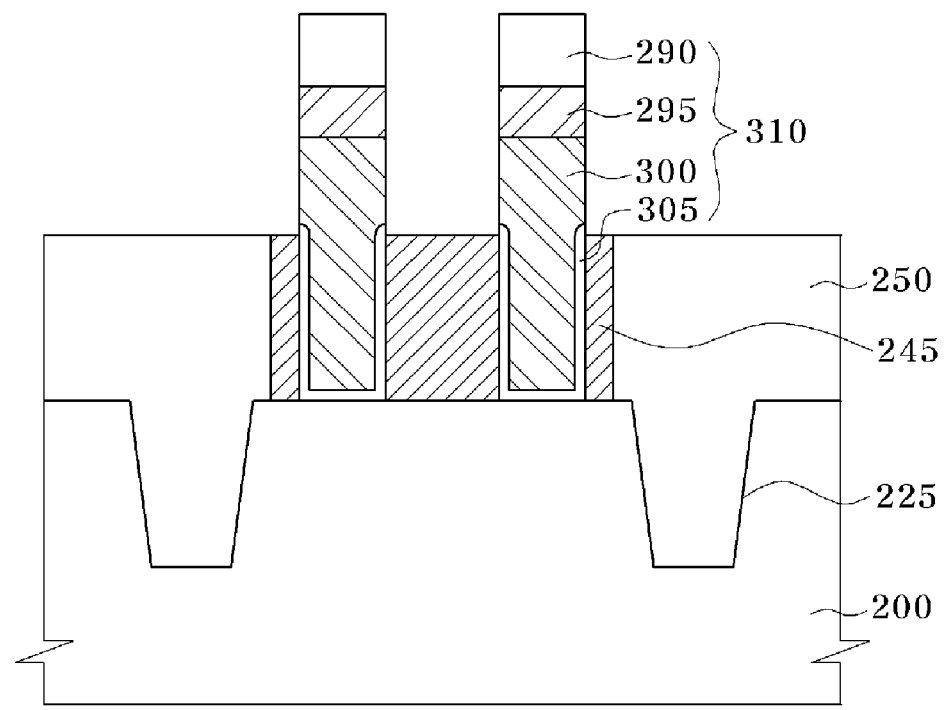

Referring to FIG. 12, a gate stack 310 is formed by patterning the hard mask layer 280, the metal layer 275, the gate conductive layer 270, and the gate insulation layer 265. Specifically, a gate mask (not shown) defining a region to be formed with the gate stack 310 is formed over the hard mask layer 280. A hard mask layer pattern 290 is formed by etching the hard mask layer 280 using the gate mask as an etch mask. The gate mask is removed using, for example, an ashing process. The gate stack 310 is formed by etching the metal layer 275, the gate conductive layer 270, and the gate insulation layer 265, using the hard mask layer pattern 290 as an etch mask. The gate stack 310 preferably includes a gate insulation layer pattern 305, a gate conductive layer pattern 300, a metal layer pattern 295, and the hard mask layer pattern 290.

Embodiment 2

Another embodiment of the invention provides a method for fabricating a transistor, in which an etch stop layer pattern is first formed at a gate forming position, a semiconductor layer for providing an active region is formed over the etch stop layer pattern, and the semiconductor layer is then etched to form a recess trench to be filled with a gate. The etch can be ended at the same time over the etch stop layer pattern, so that a plurality of the recess trenches can be formed with substantially uniform depths. Therefore, channel lengths can be substantially equal. As such, it is possible to induce the gate channels to have uniform width across the entire wafer, and it is thus possible to effectively inhibit variation in threshold voltage caused by variation in the channel length. Since distribution of the threshold voltage can be more uniform, operation properties of cell transistors constructing a memory cell can also be uniform.

FIGS. 13 through 22 illustrate a method for fabricating a transistor in a semiconductor device according to another embodiment of the invention. FIG. 23 is a table showing an etch rate of oxide based thin films.

Figure 13:
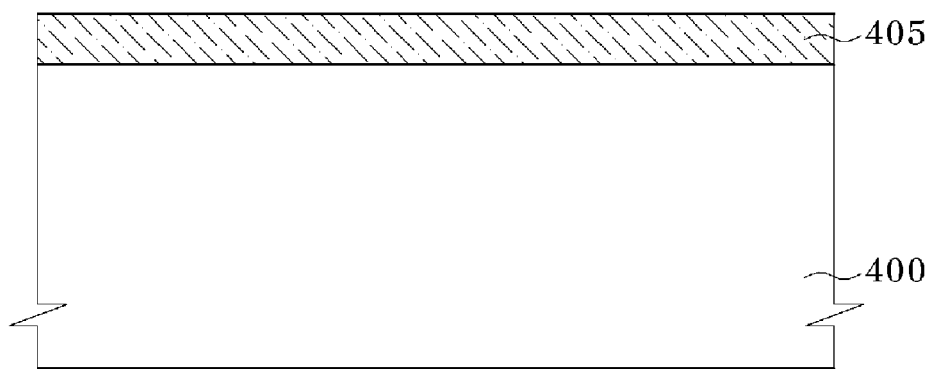
FIGS. 13 through 22 illustrate a method for fabricating a transistor in a semiconductor device according to another embodiment of the invention.

Referring to FIG. 13, an etch stop layer 405 is deposited over a semiconductor substrate 400. The etch stop layer 405 can act as an end point to end an etch process subsequently preformed to form a recess trench. The etch stop layer 405 can also act as a barrier for preventing an over etch, by which the semiconductor substrate 400 is etched undesirably. The etch stop layer 405 is preferably formed of a material having an etch selectivity to a subsequently formed semiconductor layer. The etch stop layer 405 can be formed, for example, of a phosphorous silicate glass (PSG) layer or a boron phosphorous silicate glass (BPSG) layer. By forming the etch stop layer 405 of a PSG layer or a BPSG layer, it is possible to prevent an isolation layer and a liner layer from being lost. Preferably, the etch stop layer 405 is formed to a thickness capable of effectively reducing a dip time in a wet etch solution during later process of removing an etch stop layer 405 pattern with the wet etching solution. For example, the etch stop layer 405 can be formed to a thickness in a range of 30 to 300 Å.

Figure 14:
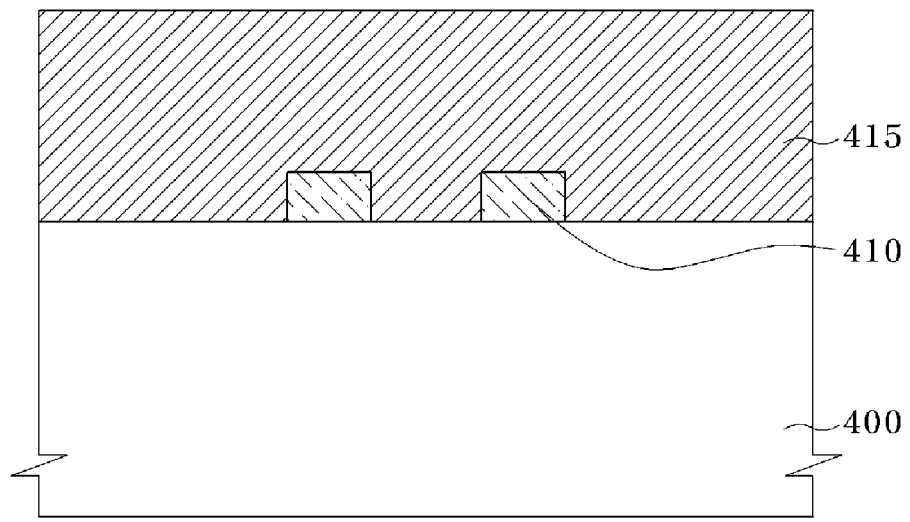

Referring to FIG. 14, an etch stop layer pattern 410, which defines a region in which a recess trench is to be subsequently formed, is formed by patterning the etch stop layer 405 (FIG. 13). A portion of the semiconductor substrate 400 blocked by the etch stop layer pattern 410, defines a region in which the recess trench is to be subsequently formed, i.e. a point to be overlapped by a gate. A semiconductor layer 415 is formed to cover the etch stop layer pattern 410 and the semiconductor substrate 400. The semiconductor layer 415 can control the depth of the subsequently formed recess trench. The semiconductor layer 415 can be formed, for example, of a silicon layer. The semiconductor layer 415 can be deposited, for example, using LPCVD, or the semiconductor layer 415 can be formed, for example, by epitaxial growth. The semiconductor layer 415 is, preferably, formed to a thickness in a range of 1000 to 1500 Å. The semiconductor layer 415 can control the depth of the subsequently formed recess trench.

Figure 15:
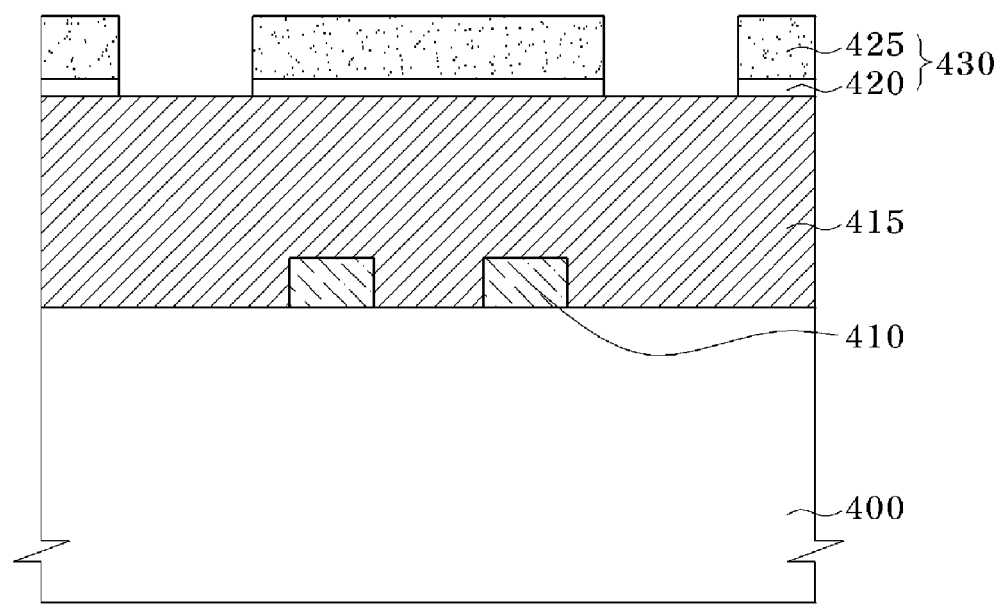

Referring to FIG. 15, a first mask layer pattern 430 is formed over the semiconductor layer 415. The first mask layer pattern 430 selectively exposes a portion of the semiconductor layer 415 in which an isolation layer can be subsequently formed. The first mask layer pattern 430 can include, for example, a pad oxide layer pattern 420 and a pad nitride layer pattern 425.

Figure 16:
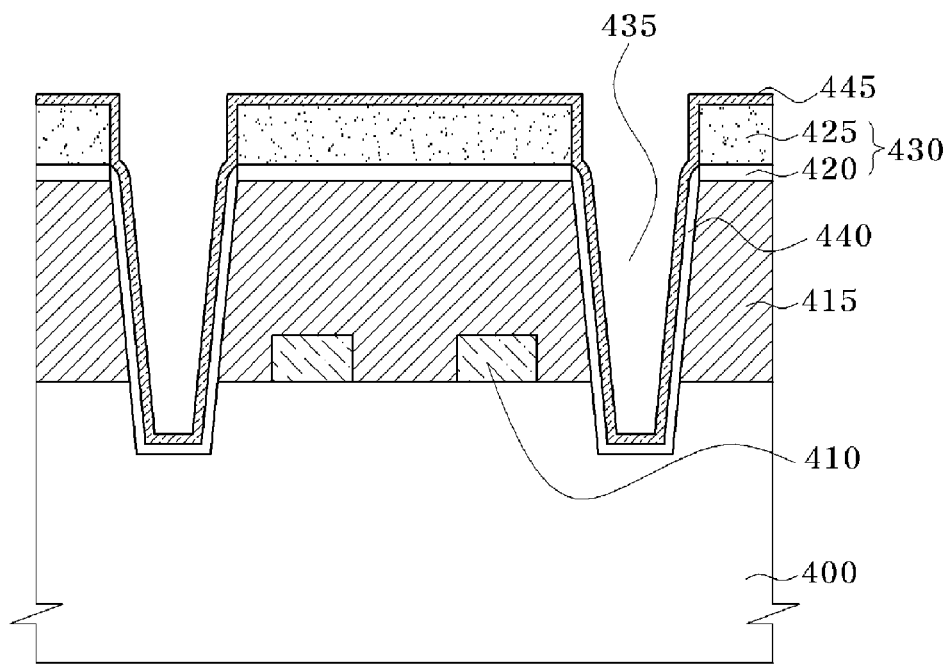

Referring to FIG. 16, a portion of the semiconductor substrate 400 is exposed by etching the exposed portion of the semiconductor layer 415, using the first mask layer pattern 430 as an etch mask. An isolation trench 435 is formed by etching the exposed semiconductor substrate 400. A side wall oxide layer 440 and a liner layer 445 for preventing leakage current and improving refresh properties can be formed on the exposed surface of the isolation trench 435. The liner layer 445 can include, for example, a nitride layer or an oxide layer.

Figure 17:
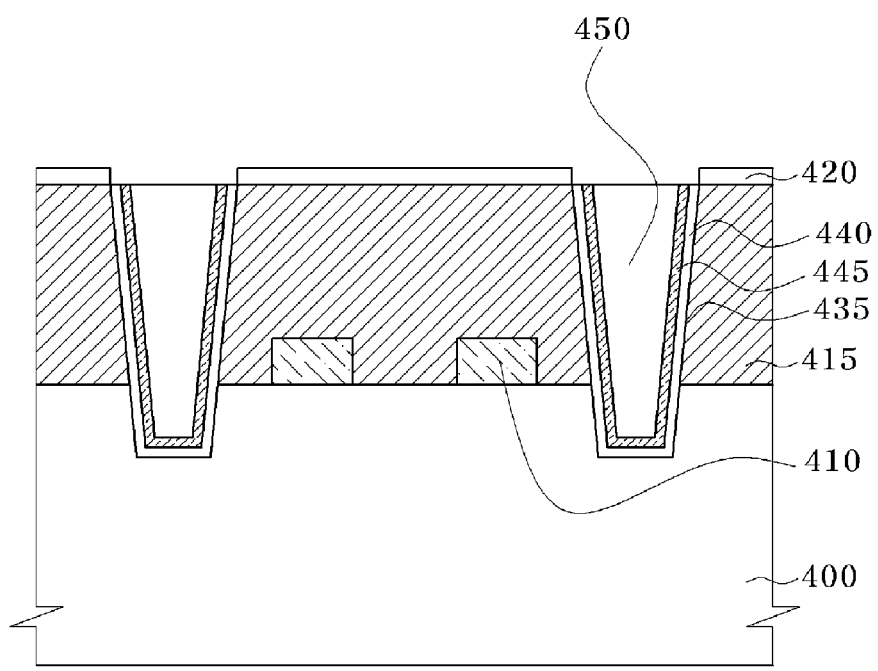

Referring to FIG. 17, an isolation layer 450 for burying the isolation trench 435 is formed. Preferably, the isolation trench 435 and the first mask layer pattern 430 (refer to FIG. 16) are buried by forming a burying insulation layer (not shown) over the semiconductor substrate 400 having the isolation trench 435. The isolation layer 450 for isolating an active region and an isolation region can be formed, for example, by performing a planarization process over the burying insulation layer until the surface of the first mask layer pattern 430 is exposed. The planarization process is, preferably, performed by a CMP. The pad nitride layer pattern 425 of the exposed first mask layer pattern 430 is removed using, for example, a phosphoric acid solution ($H_3PO_4$). Further, the isolation layer 450 protruded by removal of the pad nitride layer pattern 425 is planarized to a height substantially equal to the height of the semiconductor layer 415.

Figure 18:
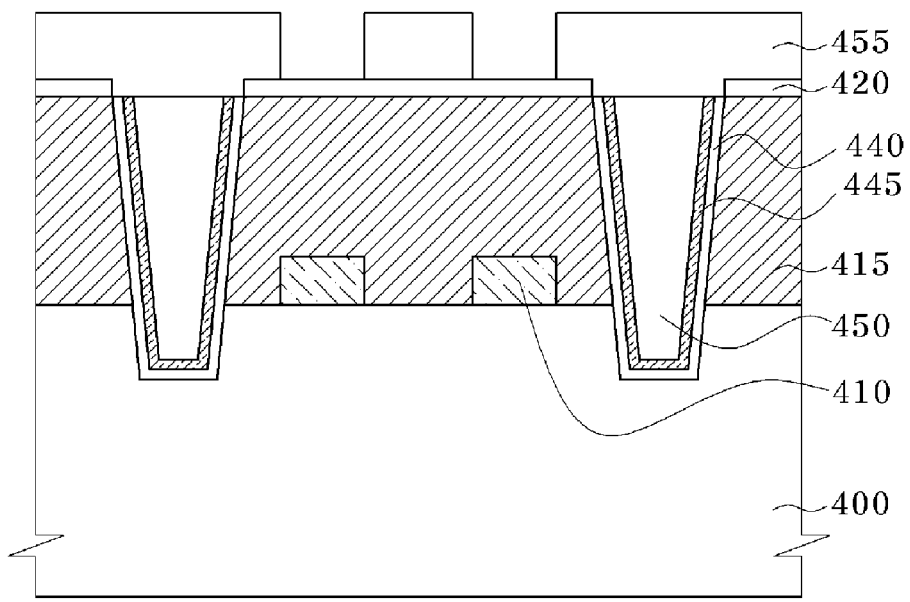

Referring to FIG. 18, a second mask layer pattern 455 for selectively exposing a portion of the pad oxide layer pattern 420 formed over the etch stop layer pattern 410 is formed over the isolation layer 450. The second mask layer pattern 455 is preferably formed to a thickness in a range of 500 to 1500 Å.

Figure 19:
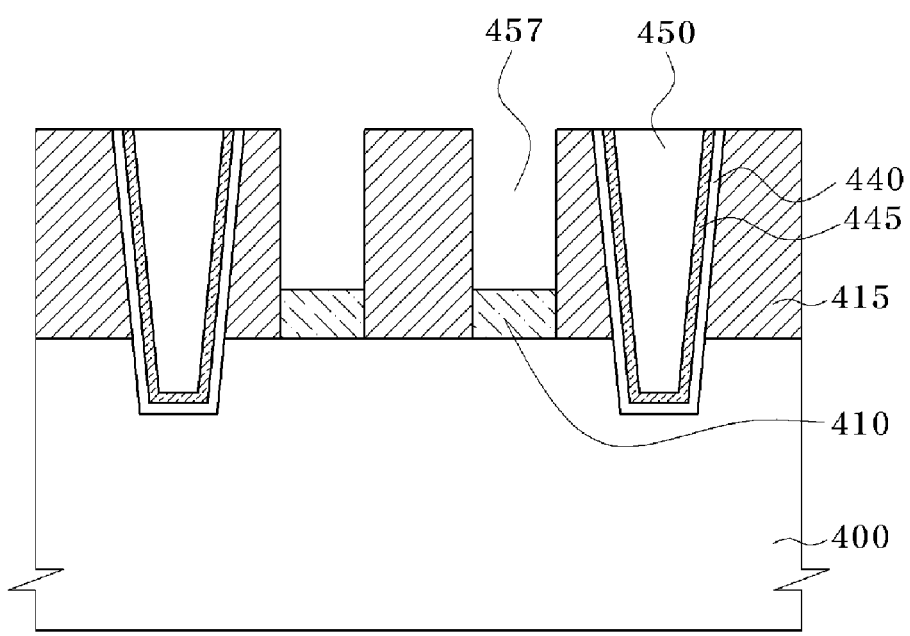

Referring to FIG. 19, a preliminary recess trench 457 for exposing an upper surface of the etch stop layer pattern 410 is formed by etching the exposed portion of the pad oxide layer pattern 420 and the semiconductor layer 415, using the second mask layer pattern 455 (refer to FIG. 18) as an etch mask. The second mask layer pattern 455 and the pad oxide layer pattern 420 remaining over the semiconductor layer 415 are then removed.

Figure 20:
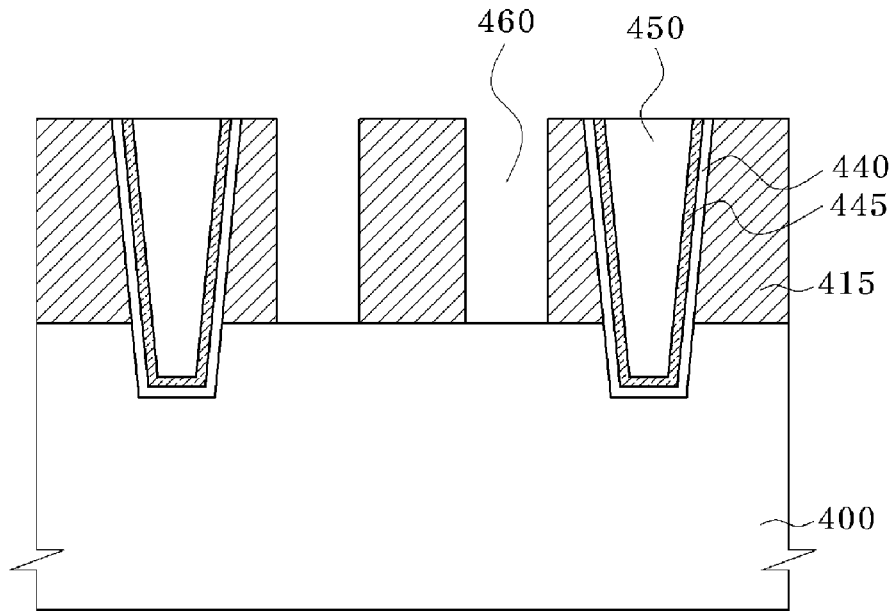
Figures 22, 23:
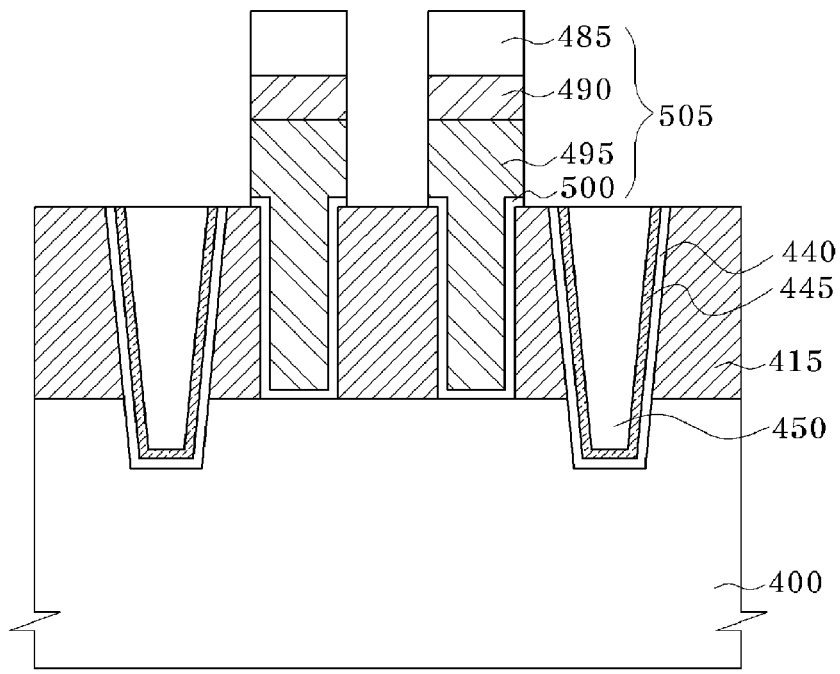
FIG. 23 is a table showing an etch rate of oxide based thin films.

Referring to FIG. 20, a recess trench 460 is formed by removing the etch stop layer pattern 410 within the preliminary recess trench 457 (refer to FIG. 19). Preferably, the semiconductor substrate 400 is dipped in a wet etch solution to remove the etch stop layer pattern 410. When forming the etch stop layer pattern 410 with a PSG layer or a BPSG layer, for example, Hydrofluoric acid (HF) solution or Buffered Oxidant Etchant (BOE) solution can be used as the wet etch solution. Referring to FIG. 23, it can be appreciated that in the HF solution or the BOE solution, a BPSG layer or a PSG layer has a higher etch rate, in a range of 2.4 to 19.6 Å/sec, than a thermal oxide layer or an oxide layer formed by a HDP process, which has an etch rate in a range of 0.2 to 19.6 Å/sec. Further, the etch stop layer pattern 410 is, preferably, formed to a thickness capable of minimizing the time for which the etch stop layer pattern 410 must be dipped in the wet etch solution to be removed by the wet etch solution. For example, the etch stop layer pattern 410 can be formed to a thickness in a range of 30 to 300 Å. Therefore, it is possible to prevent the isolation layer 450 and the liner layer 445 from being lost. With the removal of the etch stop layer pattern 410 by the wet etch process, the recess trench 460 having a depth, for example, in a range of 1000 to 1500 Å is formed over the semiconductor substrate 400. The recess trench 460 can be formed with a substantially uniform width and depth over the entire wafer by pre-setting the position and depth of the recess trench 460 with the etch stop layer pattern 410 and the semiconductor layer 415. Therefore, it is possible to prevent poor distribution of the cell threshold voltage, which can result from a non-uniform recess trench 460 depth.

Figure 21:
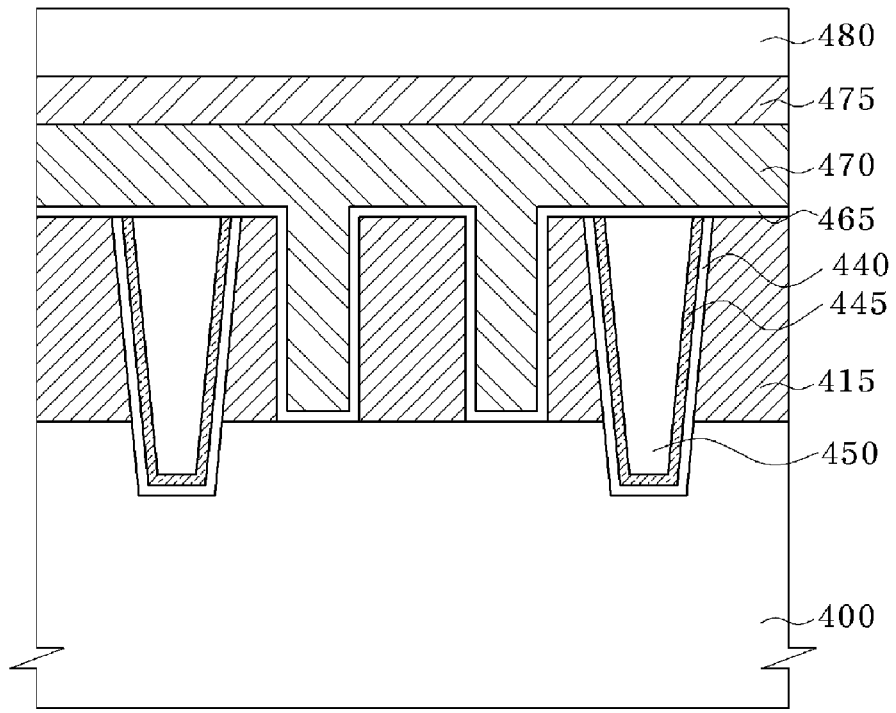

Referring to FIG. 21, a gate forming material, which can include a gate insulation layer 465, a gate conductive layer 470, a metal layer 475, and a hard mask layer 480, is deposited over the semiconductor substrate 400 having the recess trench 460. Preferably, a cleaning process is performed on the semiconductor substrate 400 after formation of the recess trench 460 to remove residues remaining over the recess trench 460 and the isolation layer 450. Preferably, the gate insulation layer 465, the gate conductive layer 470, the metal layer 475, and the hard mask layer 480 are sequentially formed over semiconductor substrate 400.

Referring to FIG. 22, a gate stack 505 is formed by patterning the hard mask layer 480, the metal layer 475, the gate conductive layer 470, and the gate insulation layer 465. Preferably, a resist layer pattern (not shown), defining a region in which the gate stack is to be subsequently formed, is formed over the hard mask layer 480. A hard mask layer pattern 485 is formed by etching the hard mask layer 480, using the resist layer mask as an etch mask. The resist layer pattern is then removed using, for example, an ashing process. The gate stack 505 is formed by etching the metal layer 475, the gate conductive layer 470, and the gate insulation layer 465, using the hard mask layer pattern 485 as an etch mask. The gate stack 505 includes a gate insulation layer pattern 500, a gate conductive layer pattern 495, a metal layer pattern 490, and the hard mask layer pattern 485.

While the invention has been described with respect to the specific embodiments, it will be apparent to those skilled in the art that various changes and modifications may be made without departing from the spirit and scope of the invention as defined in the following claims.

What is claimed is:

1. A method for fabricating a transistor in a semiconductor device, comprising:
    forming an etch stop layer pattern over a semiconductor substrate;
    forming an isolation trench in the semiconductor substrate;
    forming a burying insulation layer that fills the isolation trench and covers the etch stop layer pattern;
    forming an opening that exposes the etch stop layer pattern and a portion of the semiconductor substrate by etching the burying insulation layer;
    forming a semiconductor layer covering the etch stop layer pattern by filling the opening;
    etching the semiconductor layer to form a recess trench that exposes an upper surface of the etch stop layer pattern;
    removing the etch stop layer pattern exposed in the recess trench; and
    forming a gate that fills the recess trench.

2. The method of claim 1, wherein forming the etch stop layer pattern comprises:
    forming an etch stop layer having an etch selectivity to the semiconductor layer over the semiconductor substrate;
    forming a photoresist pattern that exposes a portion of the etch stop layer overlapped with the recess trench; and
    selectively etching the portion of the etch stop layer exposed by the photoresist pattern.

3. The method of claim 1, wherein forming the recess trench comprises:
    forming a first mask layer pattern that exposes a portion of the semiconductor layer overlapped with a portion of the etch stop layer pattern over the semiconductor layer;
    selectively etching the portion of the semiconductor layer exposed by the first mask layer pattern to expose the upper surface of the etch stop layer pattern.

4. The method of claim 1, comprising forming the etch stop layer pattern of a nitride layer.

5. The method of claim 4, comprising forming the nitride layer to a thickness in a range of 30 to 300 Å.

6. The method of claim 4, wherein removing the etch stop layer pattern comprises etching the nitride layer using phosphoric acid.

7. The method of claim 1, comprising forming the etch stop layer pattern of a Phosphorous Silicate Glass (PSG) layer or a Boron Phosphorous Silicate Glass (BPSG) layer.

8. The method of claim 1, wherein forming the semiconductor layer comprises performing Chemical Vapor Deposition (CVD) on a silicon layer or epitaxially growing a silicon layer.

* * * * *